(12) United States Patent
Wang et al.

(10) Patent No.: US 12,408,269 B2
(45) Date of Patent: Sep. 2, 2025

(54) ELECTRONIC DEVICE AND METHOD OF FORMING ELECTRONIC DEVICE

(71) Applicant: InnoLux Corporation, Miao-Li County (TW)

(72) Inventors: Cheng-Chi Wang, Miao-Li County (TW); Cheng-Hsien Ho, Miao-Li County (TW); Kuo-Sheng Yeh, Miao-Li County (TW); Jui-Jen Yueh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 500 days.

(21) Appl. No.: 17/890,242

(22) Filed: Aug. 17, 2022

(65) Prior Publication Data

US 2023/0413433 A1    Dec. 21, 2023

(30) Foreign Application Priority Data

Jun. 13, 2022    (CN) .......................... 202210667074.5

(51) Int. Cl.
*H05K 1/00* (2006.01)
*H05K 1/11* (2006.01)
*H05K 1/18* (2006.01)
*H05K 3/40* (2006.01)

(52) U.S. Cl.
CPC ............... *H05K 1/11* (2013.01); *H05K 1/182* (2013.01); *H05K 3/4007* (2013.01)

(58) Field of Classification Search
CPC ......... H05K 1/11; H05K 1/182; H05K 3/4007
See application file for complete search history.

(56) References Cited

U.S. PATENT DOCUMENTS

| 5,523,590 | A  | * | 6/1996 | Ogihara | H10H 29/14 |
| | | | | | 257/644 |
| 2017/0092567 | A1 | * | 3/2017 | Vincent | H01M 50/449 |
| 2018/0098420 | A1 | * | 4/2018 | Kariyazaki | H05K 1/0243 |
| 2020/0035591 | A1 | * | 1/2020 | Hu | H01L 23/49838 |
| 2022/0256699 | A1 | * | 8/2022 | Kim | H05K 1/09 |

FOREIGN PATENT DOCUMENTS

| CN | 103187377 B | 4/2017 |
| CN | 104253115 B | 9/2018 |
| TW | 201438173 A | 10/2014 |

* cited by examiner

*Primary Examiner* — Pete T Lee
(74) *Attorney, Agent, or Firm* — Winston Hsu

(57) ABSTRACT

An electronic device includes a first electronic unit, a second electronic unit, a bonding pad, an insulating layer and a circuit layer. The bonding pad is disposed between the first electronic unit and the second electronic unit. The insulating layer is disposed corresponding to the first electronic unit, to the second electronic unit and to the bonding pad. The first electronic unit is electrically connected with the second electronic unit through the circuit layer and through the bonding pad.

18 Claims, 5 Drawing Sheets

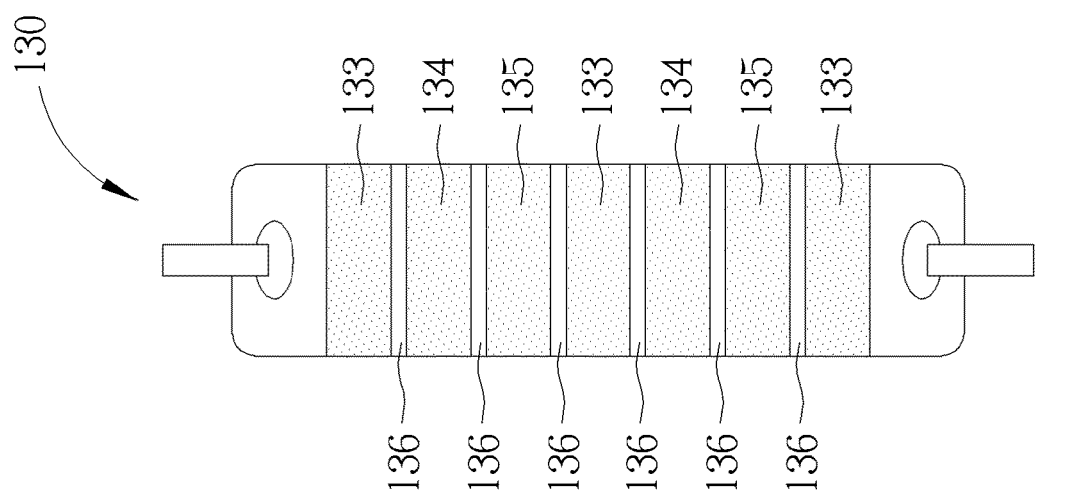
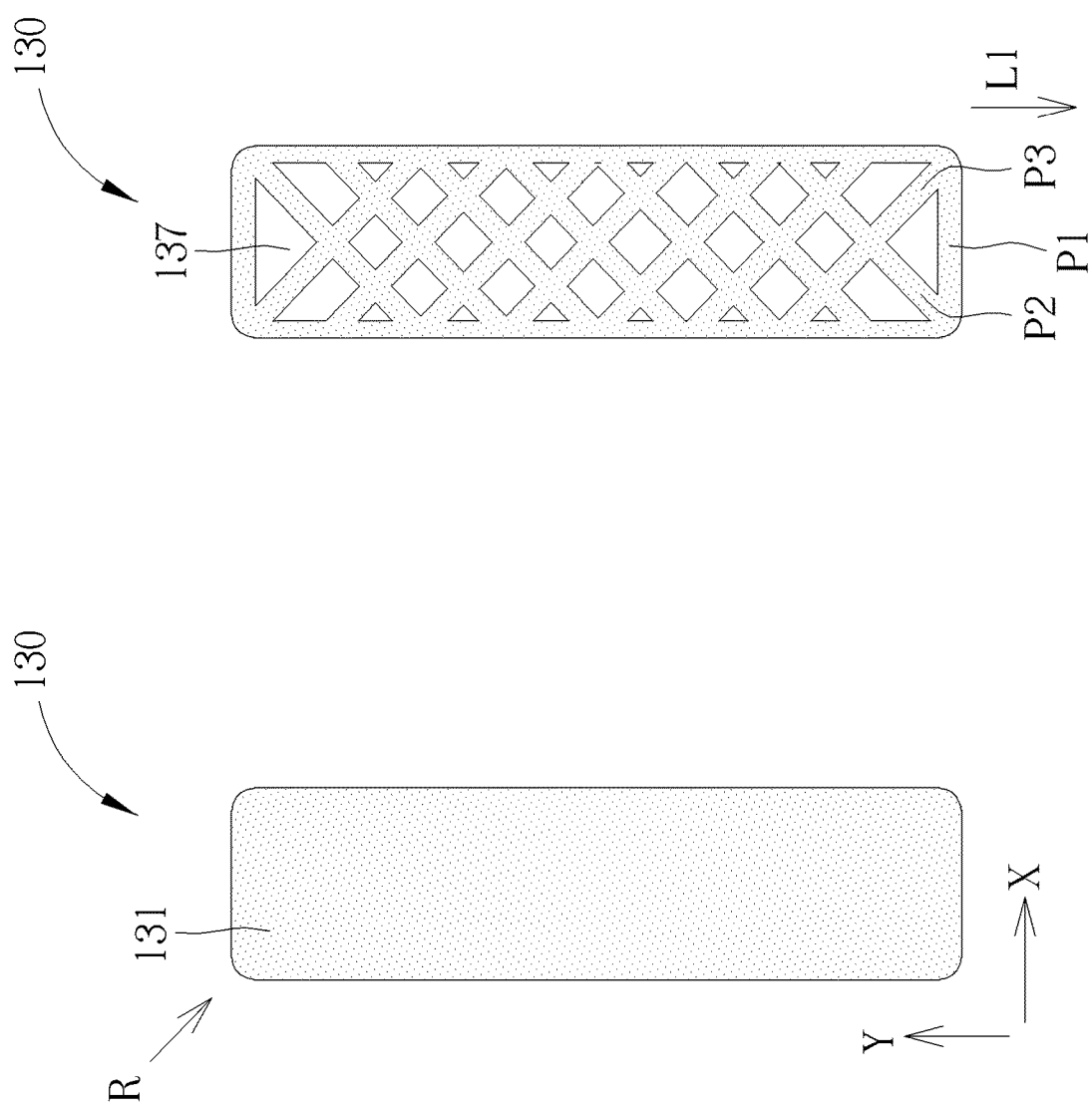
FIG. 6B
FIG. 6A
FIG. 6

ELECTRONIC DEVICE AND METHOD OF FORMING ELECTRONIC DEVICE

BACKGROUND OF THE DISCLOSURE

1. Field of the Disclosure

The present disclosure relates to an electronic device and a method of forming an electronic device, in particular to an electronic device and a method of forming the electronic device which may improve its electrical reliability.

2. Description of the Prior Art

In the manufacturing process of an electronic device, it is often necessary to transfer, for example, an electronic unit, such as a known good die (KGD), on a carrier board before an electrical connection step between several electronic units. However, there may be an electrical reliability issue between several electronic units. For example, after several chips are transferred, the position may shift off a predetermined region due to subsequent processes, which may cause electrical problems.

In view of these, it is an urgent issue to provide a method for forming an electronic device which may reduce the electrical reliability problem which is caused by position shift.

SUMMARY OF THE DISCLOSURE

Some embodiments of the present disclosure provide an electronic device. The electronic device may include a first electronic unit, a second electronic unit, a bonding pad, an insulating layer, and a circuit layer. The bonding pad is disposed between the first electronic unit and the second electronic unit. The insulating layer is disposed corresponding to the first electronic unit, to the second electronic unit and to the bonding pad. The first electronic unit is electrically connected to the second electronic unit through the circuit layer and through the bonding pad.

Some embodiments of the present disclosure further provide a method of forming an electronic device. First, a substrate is provided. The substrate includes a bonding pad, a first electronic unit and a second electronic unit. Then, an insulating layer is provided on the substrate. The insulating layer surrounds the bonding pad, the first electronic unit and the second electronic unit. The bonding pad is disposed between the first electronic unit and the second electronic unit, and the bonding pad is electrically connected to the first electronic unit and to the second electronic unit.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 1, FIG. 2, FIG. 3, FIG. 4, FIG. 5 and FIG. 6 are schematic flowcharts of some embodiments of a method for forming an electronic device according to the present disclosure, which are respectively schematic top views of an electronic device.

FIG. 6, FIG. 6A and FIG. 6B respectively illustrate a schematic partial top view of different embodiments of the bonding pad in accordance with the present disclosure.

DETAILED DESCRIPTION

Figure 1:
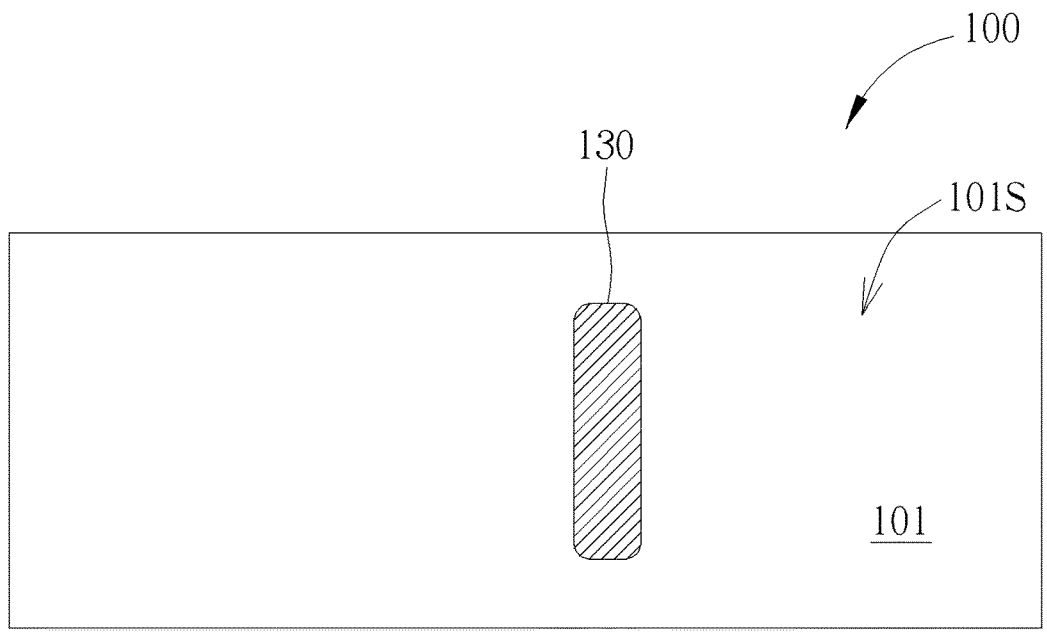

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function.

In the following description and in the claims, the terms "include", "comprise" and "have" are used in an open-ended fashion, and thus should be interpreted to mean "contain, but not limited to".

When a component or a film layer is referred to as "disposed on another component or another film layer" or "connected to another component or another film layer", it can mean that the component or film layer is directly disposed on another component or film layer, or directly connected to another component or film layer, or there may be other components or film layers in between. In contrast, when a component is said to be "directly disposed on another component or film" or "directly connected to another component or film", there is no component or film between the two. When a component or a film layer is referred to as "coupled to" another component or another film layer, it can mean that the component or film layer is directly connected to another component or film layer, or indirectly connected to another component or film layer via one or more components. And the terms of joining and connecting may also include a case where both structures are movable, or both structures are fixed. Furthermore, the terms "electrically connected" or "electrically coupled" may include any direct and indirect means of electrical connection.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following may be replaced, recombined, or mixed with one another to constitute another embodiment without departing from the spirit of the present disclosure.

FIG. 1, FIG. 2, FIG. 3, FIG. 4, FIG. 5 and FIG. 6 are schematic flowcharts of some embodiments of a method for forming an electronic device according to the present disclosure, which are respectively schematic top views of an electronic device 100. In the present disclosure, the electronic device 100 may include an antenna device, a display device, a radar device, a lidar device, a packaging element, a packaging module, etc., but the present disclosure is not limited thereto. The packaging element may include, for example, a system-in-package (SiP) or a system-on-chip (SoC) and other structures, but the present disclosure is not limited thereto. If the electronic device 100 is used in packaging, it may be applied to packaging, for example a wafer level packaging (WLP) or a panel level packaging (PLP), such as a chip-first or a redistribution-layer-first (RDL-first) packaging method, but the present disclosure is not limited thereto. It should be noted that, the electronic device may be any combination of the aforementioned device, but the present disclosure is not limited thereto. Each embodiment of the present disclosure may illustrate a combination of one or more electronic units, bonding pads, insulating layers, and circuit layers on a temporary carrier, wherein the electronic unit of the present disclosure may be a fan-out packaged semiconductor unit as an example, but the present disclosure is not limited thereto. Hereinafter, a display device may be used as an example of the electronic device of the present disclosure, but the present disclosure is not limited thereto.

As shown in FIG. 1 to FIG. 6, a substrate 101 is provided. The substrate 101 may be a temporary supporting carrier for temporarily supporting one or more electronic units, bonding pads, insulating layers, circuit layers and a combination thereof. For example, in some embodiments, the substrate 101 may include a chip, a wafer, stainless steel, an alloy, carbon fibers, glass fibers, or glass of organic materials, of inorganic materials, or of a combination thereof, but the present disclosure is not limited thereto.

As shown in FIG. 1 to FIG. 6, the substrate 101 may at least include a first electronic unit 110, a second electronic unit 120 and a bonding pad 130, but the present disclosure is not limited thereto. At this time, due to the presence of the substrate 101, the first electronic unit 110, the second electronic unit 120 and the bonding pad 130 may be disposed on the upper surface 101S of the substrate 101 in a substantially coplanar manner. The first electronic unit 110 or the second electronic unit 120 may independently include a passive element or an active element, such as a capacitor, a resistor, an inductor, a sensor, a diode, a transistor, semiconductor element, an integrated circuit (IC), a printed circuit board (PCB) etc. The diode may include a light emitting diode or a photodiode. The light emitting diode may, for example, include an organic light emitting diode (OLED), a mini LED, a micro LED, or a quantum dot LED, but the present disclosure is not limited thereto. The order of providing the first electronic unit 110, the second electronic unit 120 and the bonding pad 130 on the substrate 101 may be optionally arranged according to the situations as follows.

Figure 2:
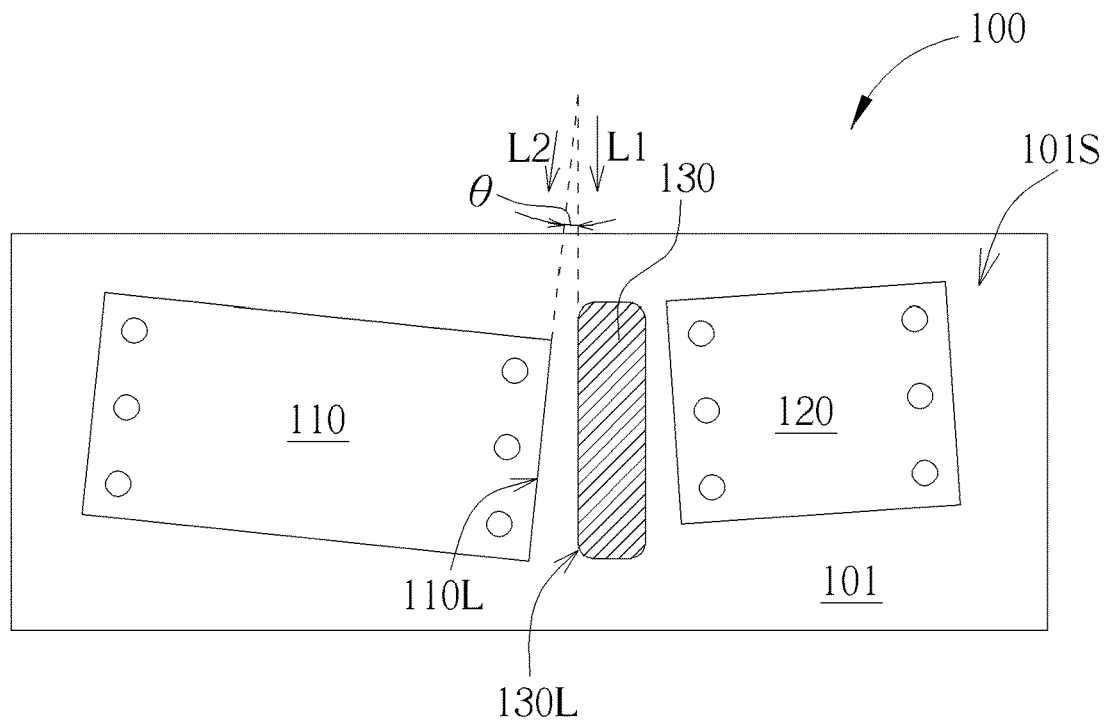
Figure 3:
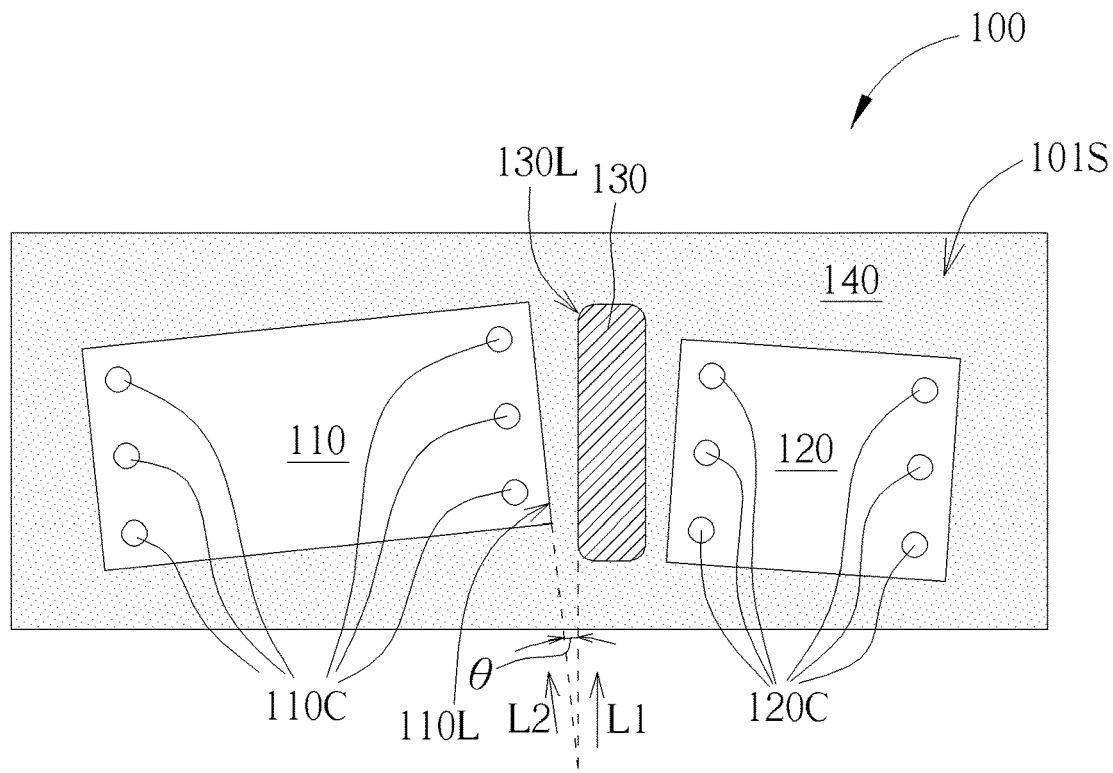

FIG. 1 illustrates a schematic top view of an embodiment of a method of forming an electronic device 100 according to the present disclosure. For example, as shown in FIG. 1, in some embodiments, at least one bonding pad 130 may be provided on the upper surface 101S of the substrate 101 in advance. For the convenience of description, the following disclosure is an example of providing a bonding pad 130 on the upper surface 101S of the substrate 101 in advance. For example, in a top view, a bonding pad 130 may be provided at a position of the substrate 101 in advance, and spaces for a first electronic unit (not shown) and for a second electronic unit (not shown) are reserved on the left side and the right side of the bonding pad 130, but the present disclosure is not limited thereto. Then, as shown in FIG. 2, in a top view, the first electronic unit 110 and the second electronic unit 120 may be further provided on the upper surface 101S of the substrate 101 in the presence of the bonding pad 130 so that the bonding pad 130 is disposed between the first electronic unit 110 and the second electronic unit 120 on the upper surface 101S of the substrate 101. The manufacturing method of providing the bonding pad 130 on the substrate 101 in advance is beneficial, for example, to facilitate the position limit reference of the first electronic unit (not shown) and the second electronic unit (not shown). The bonding pad 130 is provided on the substrate 101 before the first electronic unit and the second electronic unit are provided so that the bonding pad 130 may be, for example, served as an alignment mark, but the present disclosure is not limited thereto.

Figure 1A:
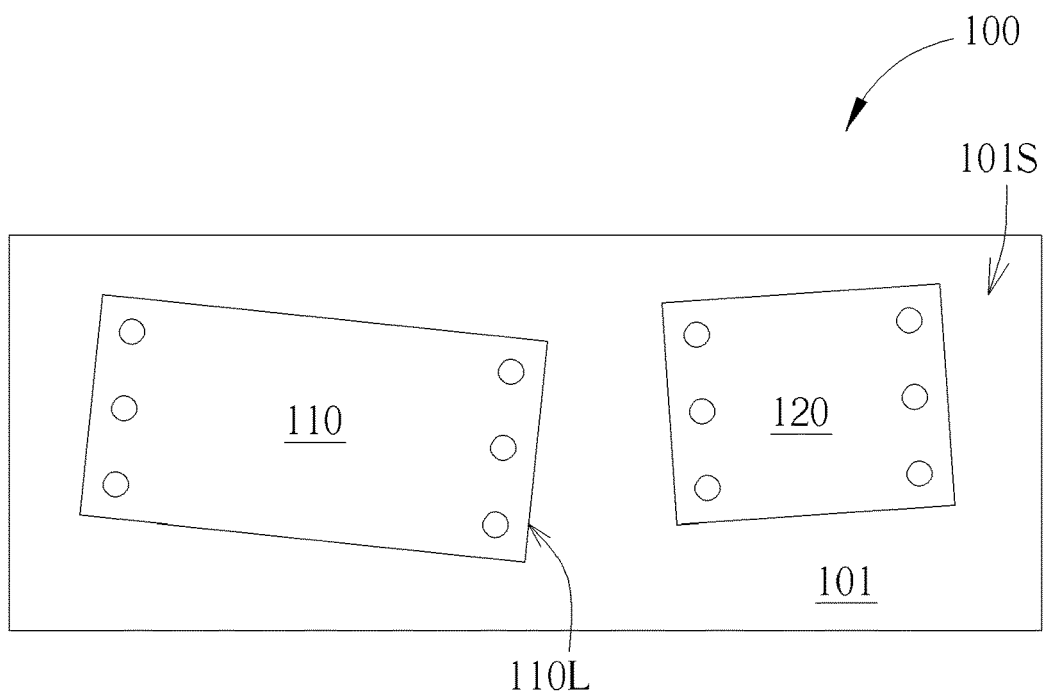
FIG. 1A is a schematic top view of a variant example of another embodiment of a method of forming an electronic device according to the present disclosure.

FIG. 1A is a schematic top view of a variant embodiment of a method of forming an electronic device 100 according to the present disclosure. Alternatively, as shown in FIG. 1A, in some embodiments, the first electronic unit 110 and the second electronic unit 120 may be provided on the substrate 101 in advance. For example, in a top view, the first electronic unit 110 and the second electronic unit 120 may be provided on the upper surface 101S of the left side and right side of the substrate 101 in advance to reserve space for a bonding pad in the middle of the substrate 101, but the present disclosure is not limited thereto. Then, as shown in FIG. 2, a bonding pad 130 may be provided on the upper surface 101S of the substrate 101 in the presence of the first electronic unit 110 and of the second electronic unit 120 so that the bonding pad 130 is disposed between the first electronic unit 110 and the second electronic unit 120. The fabrication method of providing the first electronic unit 110 and the second electronic unit 120 on the substrate 101 in advance is advantageous, for example, to facilitate the flexible arrangement of the process. For example, in the process of transferring an electronic unit to the substrate, the transfer may be less susceptible to interference from other components, but the present disclosure is not limited thereto.

When the first electronic unit 110, the second electronic unit 120 and the bonding pad 130 are respectively provided on the substrate 101, between the first electronic unit 110 and the bonding pad 130, or between the second electronic unit 120 and the bonding pad 130 there may be not parallel arrangement. As shown in FIG. 2, the bonding pad 130 may have an extending direction L1 along the long side 130L of the bonding pad 130. Similarly, the side 110L of the first electronic unit 110 which is close to the long side 130L of the bonding pad 130 may have an extension direction L2. According to some embodiments of the present disclosure, between the extension direction L1 and the extension direction L2 there may be an angle θ. If the first electronic unit 110 and the bonding pad 130 are not arranged parallel to each other, the angle θ may not be equal to 0. In some embodiments, the angle θ may be greater than or equal to 0. In some embodiments, the angle θ may be smaller than 45°, for example, 0≤θ<45°, but the present disclosure is not limited thereto. According to some embodiments, the angle θ may be greater than or equal to 0 and less than 15°, but the present disclosure is not limited thereto. For example, the angle θ may be detected by an automatic optical system (Auto-Optical Inspection, AOI). When the angle θ is greater than or equal to 0 and less than 45°, it is beneficial to improve the electrical reliability between electronic units, but the present disclosure is not limited thereto.

In some embodiments, the bonding pad 130 may include a conductor layer 131 (shown in FIG. 5A) disposed corresponding to the base layer 132. The conductor layer 131 may include a metal conductive material or a non-metallic conductive material with low electric resistance, such as copper, nickel, gold, silver, tin, a transparent conductive material, other suitable materials, or a combination of the above conductive materials for packaging, but the present disclosure is not limited thereto. The transparent conductive material may include a transparent conductive material such as indium tin oxide (ITO), indium zinc oxide (IZO), and indium gallium zinc oxide (IGZO), but the present disclosure is not limited thereto. In some embodiments, a suitable process may be used to form the conductor layer 131. A suitable process may include, for example, a plating process, a coating process, other suitable processes, or a combination thereof, but the present disclosure is not limited thereto. The bonding pad 130 of the present disclosure may be used as an auxiliary conductive line in a region, so that two electronic units may be electrically connected through the bonding pad 130 to serve as a connecting component. The bonding pad 130 may include, for example, a quadrangle, a circle or other shapes, but the present disclosure is not limited thereto. In a top view, the bonding pad 130 may include, for example, a rounded corner, an arc-shaped corner, a grid shape or other different implementations. By providing the bonding pad 130 with a rounded corner or an arc-shaped corner, for example, the tip discharge effect may be reduced, and the reliability of the electronic device may be improved, but the present disclosure is not limited thereto.

Next, as shown in FIG. 1 to FIG. 6, an insulating layer 140 may be further provided on the upper surface 101S of the substrate 101. For example, in some embodiments, the insulating layer 140 may be provided so that the insulating layer 140 surrounds the first electronic unit 110, the second electronic unit 120, and the bonding pad 130. In other words, the insulating layer 140 may be disposed corresponding to the first electronic unit 110, to the second electronic unit 120 and to the bonding pad 130. According to some embodiments of the present disclosure, the above-mentioned "disposed corresponding to" may refer to the insulating layer 140 in direct contact with at least apart of the corresponding element, for example, in a top view, to an arrangement in direct contact with at least one side of the first electronic unit 110 or with at least one side of the second electronic unit 120. According to some embodiments, the insulating layer 140 surrounding the first electronic unit 110, the second electronic unit 120 and the bonding pad 130, for example, in a cross-sectional view, may refer to the insulating layer 140 in direct contact with at least two sides of the first electronic unit 110, of the second electronic unit 120 and of the bonding pad 130. The insulating layer 140 may be a soft, film-like, powder-like or liquid encapsulating material before being provided; for example, may include a pre-polymerized epoxy encapsulating material, but the present disclosure is not limited thereto. After the pre-polymerized epoxy encapsulation material is cured, the cured insulating layer 140 may be formed, but the present disclosure is not limited thereto. For example, the insulating layer 140 in direct contact with the corresponding element is beneficial to prevent moisture or oxygen from contacting or penetrating the corresponding element, that is, the weather resistance of the electronic device may be improved, but the present disclosure is not limited thereto.

Then, as shown in FIG. 1 to FIG. 6, after the insulating layer 140 is provided on the upper surface 101S of the substrate 101, the substrate 101 may be flipped over so that the upper surface 101S shown in FIG. 2 is disposed upside down. The step of flipping over the substrate 101 may also include the step of removing the temporary substrate 101. Optionally, the step of flipping over the substrate 101 and the step of removing the substrate 101 may be carried out separately. For example, in some embodiments, the step of flipping over the substrate 101 may be carried out before the step of removing the substrate 101 is carried out. Alternatively, in some embodiments, the step of removing the substrate 101 may be carried out before the step of flipping over the substrate 101 is carried out. After the step of removing the substrate 101, the bonding terminals 110C of the first electronic unit 110 and the bonding terminals 120C of the second electronic unit 120 may be respectively exposed. According to some embodiments of the present disclosure, the bonding pad 130 may be provided to electrically connect the first electronic unit 110 or the second electronic unit 120. For example, in some embodiments, the bonding pad 130 may be provided to electrically connect the bonding terminals 110C of the first electronic unit 110 and the bonding terminals 120C of the second electronic unit 120 so that the first electronic unit 110 may be electrically connected to the second electronic unit 120 through the bonding pad 130.

As shown in FIG. 1 to FIG. 6, in a top view, a circuit layer 150 may be provided on the insulating layer 140 (shown in FIG. 3), so that the first electronic unit 110 may be electrically connected to the bonding pad 130 through the circuit layer 150 on the insulating layer 140, and the bonding pad 130 may be electrically connected to the second electronic unit 120 through the circuit layer 150 on the insulating layer 140 for example, so that the bonding terminals 110C of the first electronic unit 110 may be electrically connected to the bonding terminals 120C of the second electronic unit 120 through the bonding pad 130. According to some embodiments of the present disclosure, a suitable process may be used to provide the circuit layer 150 to serve as an electrical wire between the first electronic unit 110 and the second electronic unit 120. In some embodiments, the circuit layer 150 may be provided by, for example, a photo process combined with a lithography process, an electroplating process, a coating process, other suitable processes, or a combination thereof, but the present disclosure is not limited thereto.

Figure 4:
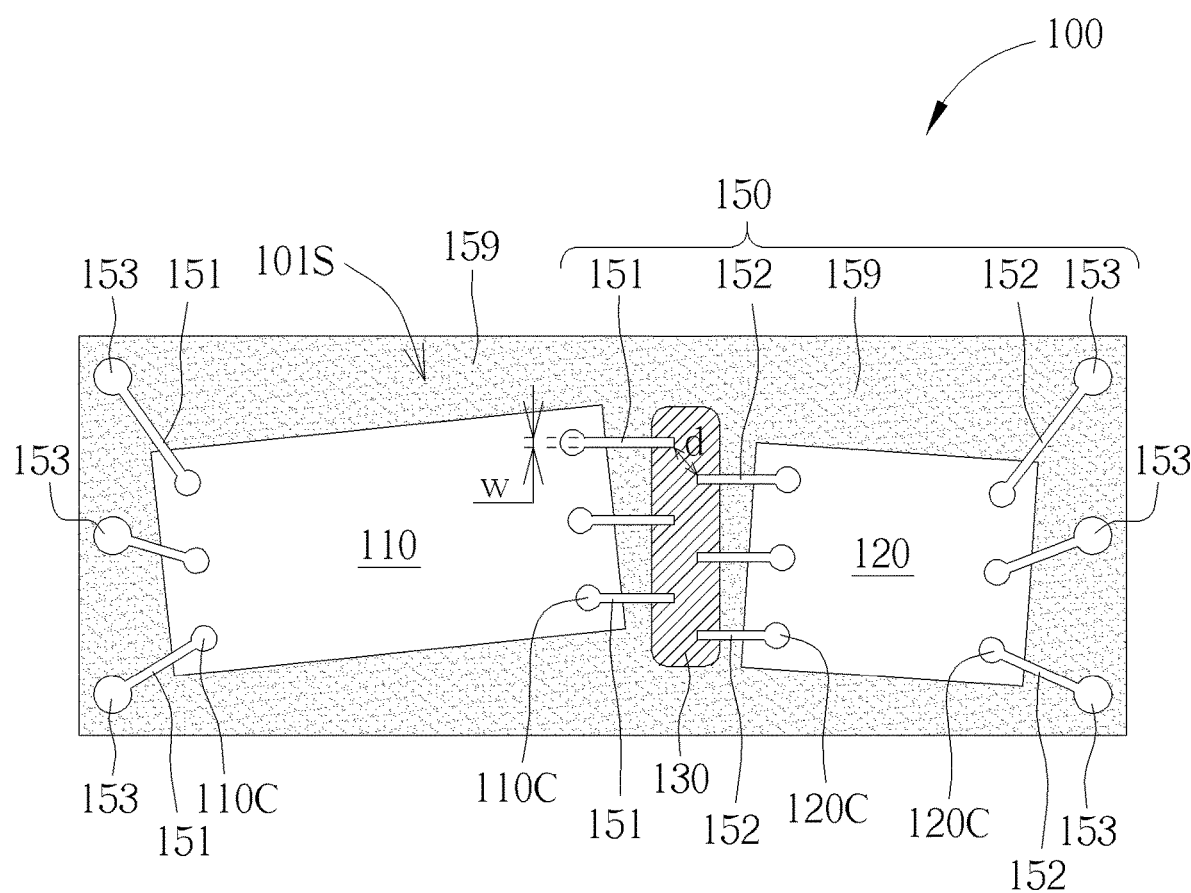

According to some embodiments of the present disclosure, the circuit layer 150 may include a composite layer structure, for example, may include a multi-layer conductive layer and a multi-layer insulating layer, to provide the needed circuit pattern and distribution by the connection between the multi-layer conductive layer and the multi-layer insulating layer. Therefore, the circuit layer 150 may be regarded as a redistribution layer (RDL). The multi-layer conductive layer and the multi-layer insulating layer may stack on one another to form a fan-out panel level packaging (FOPLP), for example, to be beneficial for the electronic device to have higher input/output (I/O) density, or to reduce the size of the electronic device. The conductive layer in the circuit layer 150 may include, for example, a first conductive layer 151, a second conductive layer 152 and a stud 153, but the present disclosure is not limited thereto. The materials of the conductive layer in the circuit layer 150 may include, for example, titanium, copper, electroplated copper, other suitable conductive materials, or a combination thereof, but the present disclosure is not limited thereto. On the other hand, the circuit layer 150 may include multiple insulating layers. In FIG. 4 one insulating layer 159 is used to represent one or more insulating layers in the circuit layer 150. For example, the multi-layer insulating layer may include an organic material or an inorganic material, and the organic material or the inorganic material may include, for example, photosensitive polyimide (PSPI), a build-up film (ABF), silicon oxide (SiOx), silicon nitride (SiNx), Silicon oxynitride (SiOxNy), other suitable insulating materials or a combination thereof, but the present disclosure is not limited thereto. According to some embodiments of the present disclosure, the circuit layer 150 may include an element such as a transistor, a capacitor, a diode, and a resistor, but it is not limited thereto. According to some embodiments of the present disclosure, the first electronic unit 110 may be electrically connected to the conductor layer 131 of the bonding pad 130 through the circuit layer 150 on the insulating layer 140. According to some embodiments of the present disclosure, the conductive layer 131 of the bonding pad 130 may be electrically connected to the second electronic unit 120 through the second conductive layer 152 of the circuit layer 150. Electronic units such as the first electronic unit 110 or the second electronic unit 120, for example, may be disposed between the circuit layer 150 and the insulating layer 140.

As shown in FIG. 1 to FIG. 6, in a top view, the circuit layer 150 is provided, so that the first electronic unit 110 may be electrically connected to the bonding pad 130 through the circuit layer 150 on the insulating layer 140, and after the bonding pad 130 is electrically connected to the second electronic unit 120 through the circuit layer 150 on the insulating layer 140, the step of dividing the bonding pad 130 may be further carried out, so that the bonding pad 130 may form a plurality of bonding pad regions, for example, divided to form independent bonding pad region 133, bonding pad region 134 and bonding pad region 135. There may be a dividing line 136 disposed between adjacent bonding pad regions. According to some embodiments of the present disclosure, suitable processes may be used to divide the bonding pad 130 to form the dividing line 136, for example, a laser cutting process, an etching process, other suitable processes, or a combination thereof, but the present disclosure is not limited thereto.

Figure 5:
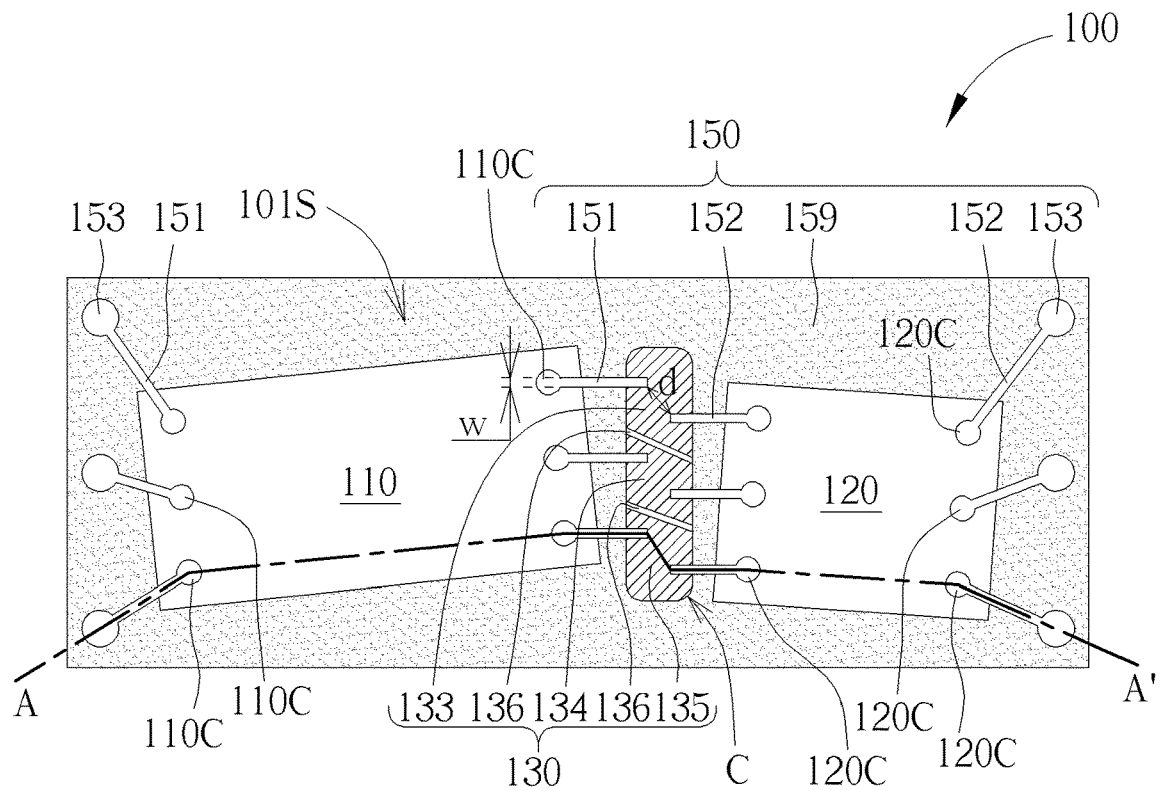
Figure 5A:
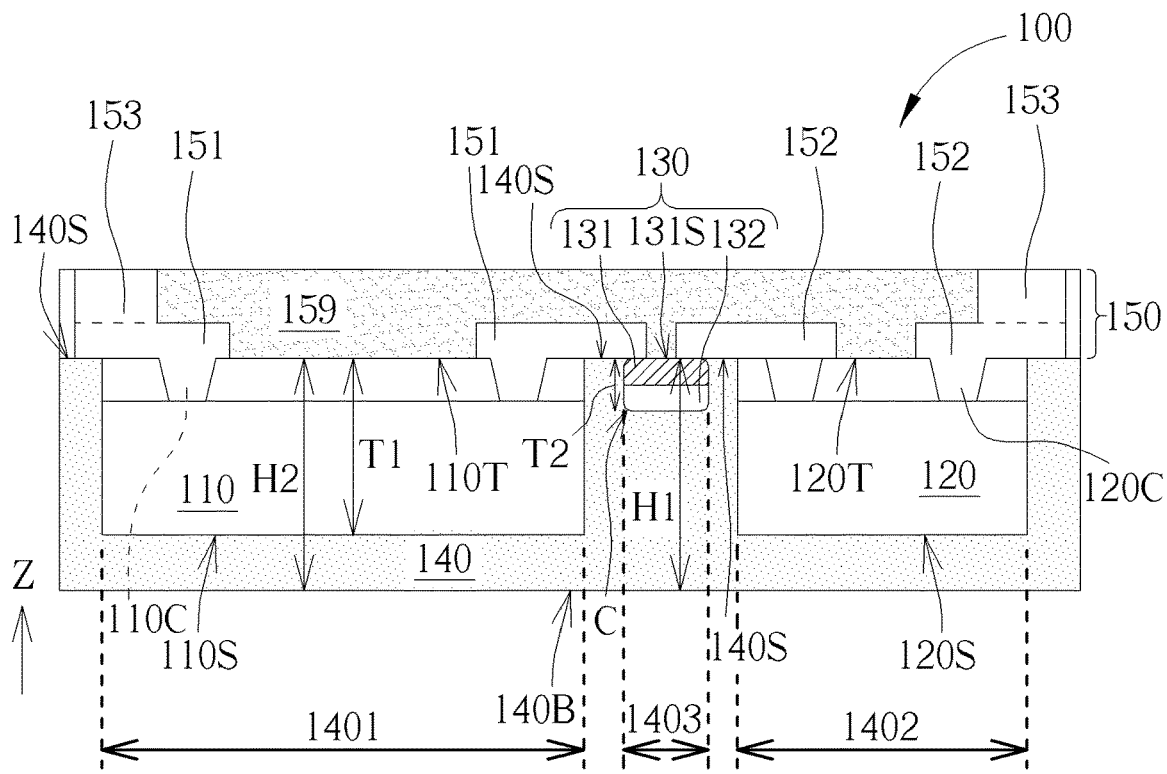
FIG. 5A is a schematic cross-sectional view of the electronic device according to some embodiments of the present disclosure along the line A-A' in FIG. 5.

After the above steps, an electronic device 100 according to some embodiments of the present disclosure may be provided. FIG. 5A is a schematic cross-sectional view of the electronic device 100 according to some embodiments of the present disclosure along the line A-A' in FIG. 5, wherein the Z direction is the normal direction of the electronic device 100. Please refer to FIG. 5 and to FIG. together, the electronic device 100 according to some embodiments of the present disclosure may include a first electronic unit 110, a second electronic unit 120, a bonding pad 130, an insulating layer 140 (in FIG. 5A), and a circuit layer 150.

The first electronic unit 110 or the second electronic unit 120 may respectively include a passive element or an active element. Please refer to the above for details. The bonding pad 130 may be disposed between the first electronic unit 110 and the second electronic unit 120. According to some embodiments of the present disclosure, the bonding pad 130 may include a plurality of bonding pad regions that are not connected to each other or are electrically insulated from each other; for example, may include a plurality of bonding pad region 133, bonding pad region 134, and bonding pad region 135 which are independently arranged, but the present disclosure is not limited thereto. There may be a dividing line 136 disposed between adjacent bonding pad regions so that the adjacent bonding pad regions are not connected, but the present disclosure is not limited thereto. In some embodiments, the bonding pad 130 may include at least a conductor layer 131, and the conductor layer 131 may include a metallic conductive material or a non-metallic conductive material with low electric resistance, such as copper, aluminum, titanium, molybdenum, nickel, gold, silver, tin, a transparent conductive material, other suitable materials, or a combination thereof to serve as a conductive material for packaging, but the present disclosure is not limited thereto. The transparent conductive material may include a transparent conductive material such as indium tin oxide (ITO), indium zinc oxide (IZO), and indium gallium zinc oxide (IGZO), but the present disclosure is not limited thereto. In some embodiments, the bonding pad 130 may further include a base layer 132, so that the conductor layer 131 may be disposed on the base layer 132, and the base layer 132 may be disposed between the conductor layer 131 and the insulating layer 140. The base layer 132 may, for example, facilitate the bottom layer of the bonding pad 130 to be close to the material properties of the insulating layer 140 so that the bonding pad 130 may be easily integrated with the insulating layer 140. The base layer 132 may include an organic material or an inorganic material, such as silicon, glass, ceramic, plastic, other suitable materials or a combination thereof, but the present disclosure is not limited thereto. In some embodiments, suitable processes may be used to form the conductor layer 131; for example may include an electroplating process, a coating process, other suitable processes or a combination thereof, but the present disclosure is not limited thereto. In some embodiments, in a schematic cross-sectional view, such as shown in FIG. 5A, the base layer 132 may have at least one rounded corner C, but the present disclosure is not limited thereto. By the design of the base layer 132 with the rounded corner, the risk of cracking between the interface of the base layer 132 and the insulating layer 140 may be reduced, but the present disclosure is not limited thereto. In some embodiments, the Young's modulus of the base layer 132 may be, for example, between 1000 MPa and 20000 MPa, but the present disclosure is not limited thereto. In some embodiments, the coefficient of thermal expansion (CTE) of the base layer 132 may be, for example, between 3 ppm/° K and 10 ppm/° K, but the present disclosure is not limited thereto. The base layer 132 having the above-mentioned properties may allow the bonding pad 130 including the base layer 132 to have the advantage of being close to the material properties of the insulating layer 140 so that the bonding pad 130 may be easily integrated with the insulating layer 140. In other words, with the provision of the base layer 132, the risk of cracking between the bonding pad 130 and the insulating layer 140 may be reduced.

As shown in FIG. 1 to FIG. 6 the bonding pad 130 may include a bonding pad region 133, a bonding pad region 134, and a bonding pad region 135, and the extension line L1 may pass through one side of the bonding pad region 133, of the bonding pad region 134 and of the bonding pad region 135. The side 110L of the first electronic unit 110 adjacent to the side of the bonding pad region 133, of the bonding pad region 134 and of the bonding pad area 135 may have an extension line L2. There may be an angle θ between the extension line L1 and the extension line L2. If the first electronic unit 110 and the bonding pad 130 are not arranged parallel to each other, the angle θ may not be equal to 0. According to some embodiments of the present disclosure, the angle θ may be greater than or equal to 0. In some embodiments, when reliability is taken into consideration, the angle θ may be smaller than 45°, for example, 0≤θ<45°, but the present disclosure is not limited thereto. According to some embodiments, the angle θ may be greater than or equal to 0 and less than 15°, but the present disclosure is not limited thereto. For example, the angle θ may be detected by an automatic optical system (Auto-Optical Inspection, AOI). When the angle θ is greater than or equal to 0 and less than 45°, it is beneficial to improve the electrical reliability between electronic units. The sides of the bonding pad region 133, of the bonding pad region 134, the side edges of the bonding pad region 135 and the longer side 130L of the bonding pad 130 may have the same extending direction. With the design of a rounded corner or of an arc-shaped corner of the bonding pad 130, for example, the tip discharge effect may be reduced, to advantageously improve the reliability of the electronic device, but the present disclosure is not limited thereto.

The bonding pad 130 of the present disclosure may have various different implementations. FIG. 6, FIG. 6A and FIG. 6B respectively illustrate a schematic partial top view of different embodiments of the bonding pad 130 corresponding to FIG. 5 in accordance with the present disclosure, wherein the extension line L1 is parallel to the Y direction, the X direction is perpendicular to the Y direction, and the X direction and the Y direction are respectively perpendicular to the Z direction shown in FIG. 5A. As shown in FIG. 6, in some embodiments, the bonding pad 130 of the present disclosure may have a shape of a solid structure; in other words, the bonding pad 130 of the present disclosure may be a complete piece of linear pattern or a complete piece of rectangular conductive material, generally with smooth sides or with rounded corners. It may be optionally patterned to form a plurality of bonding pad regions, but the present disclosure is not limited thereto. Or as shown in FIG. 6A, in some embodiments, the bonding pad 130 of the present disclosure may have a shape of hollow structures; in other words, the bonding pad 130 of the present disclosure may be provided with grid patterns. For example, the bonding pad 130 may be composed of a plurality of parts, such as a nm part P1 roughly in a rectangular shape or in a square shape, a long strip-shaped part P2 having a first oblique direction, and a long strip-shaped part P3 having a second oblique direction R. The first oblique direction may be generally orthogonal to the second oblique direction R but is not parallel to the extending direction L1 of the bonding pad 130, so that the parts P2 and the parts P3 may be interspersed, and an opening 137 may be formed between a part P2 and a part P3. The opening 137 may expose the conductor layer 131 (please see FIG. 5A) beneath the insulating layer 140 (please see FIG. 5A) or expose the insulating layer 140 (please see FIG. 5A) beneath the base layer 132 (please see FIG. 5A). Or as shown in FIG. 6B, in some embodiments, the bonding pad 130 of the present disclosure may be in the form of stripes; in other words, the bonding pad 130 of the present disclosure may be provided with alternately arranged bonding pad region 133, bonding pad region 134, bonding pad region 135 and the dividing line 136 so that the adjacent bonding pad regions are separated by the dividing line 136 and arranged along the extending direction L1. The bonding pad 130 may include an electrically breakable wire type. For example, some portion of the bonding pad 130 may be broken by controlled electric current to form a plurality of bonding pad regions segregated by the dividing lines 136. A single bonding pad region may be used as a single electrical connection island corresponding to a bonding terminal (please see FIG. 5) of the first electronic unit 110 (please see FIG. 5) and to a bonding terminal (please see FIG. 5) of the second electronic unit 120 (please see FIG. 5).

As shown in FIG. 5A, the first electronic unit 110 or the second electronic unit 120 may respectively have an appropriate electronic unit thickness. The electronic unit thickness of the first electronic unit 110 may be a vertical distance which is measured from the top surface 110T of the first electronic unit 110 to the bottom surface 110S of the first electronic unit 110 along the normal direction (Z direction) of the electronic device 100. Similarly, the electronic unit thickness of the second electronic unit 120 may be a vertical distance which is measured from the top surface 120T of the second electronic unit 120 to the bottom surface 120S of the second electronic unit 120 along the normal direction of the electronic device 100. The thickness of the bonding pad 130 may be a vertical distance which is measured from the top surface 131S of the bonding pad 130 to the bottom surface of the bonding pad 130 along its normal direction. If the electronic unit thickness of the first electronic unit 110 and the electronic unit thickness of the second electronic unit 120 are different, the maximum thickness of the electronic unit thickness of the first electronic unit 110 and the second electronic unit 120 is referred to as the maximum thickness T1 (the first electronic unit 110 shown in the figure has the maximum thickness T1, but the present disclosure is not limited thereto), and the thickness of the bonding pad is T2. According to some embodiments of the present disclosure, the thickness of the electronic unit and the thickness of the bonding pad 130 may satisfy $T1 \geq T2$. The above arrangement may reduce the risk of circuit layer transfer when the thickness difference is too large, but the present disclosure is not limited thereto.

The insulating layer 140 may include a first portion 1401, a second portion 1402 and a third portion 1403. The first portion 1401 may correspond to the first electronic unit 110, the second portion 1402 may correspond to the second electronic unit 120, and the third portion 1403 may correspond to the bonding pad 130. The first portion 1401, the second portion 1402 and the third portion 1403 may respectively have an appropriate height. The height corresponding to the first portion 1401 of the first electronic unit 110 may be a vertical distance which is measured from the top surface 110T of the first electronic unit 110 to the bottom surface 140B of the insulating layer 140 along the normal direction (Z direction) of the electronic device 100. The height corresponding to the second portion 1402 of the second electronic unit 120 may be a vertical distance which is measured from the top surface 120T of the second electronic unit 120 to the bottom surface 140B of the insulating layer 140 along the normal direction (Z direction) of the electronic device 100. The height corresponding to the third portion 1403 of the bonding pad 130 may be a vertical distance which is measured from the top surface 131S of the bonding pad 130 to the bottom surface 140B of the insulating layer 140 along the normal direction (Z direction) of the electronic device 100. The height of the third portion 1403 corresponding to the bonding pad 130 is H1. If the height of the first portion 1401 corresponding to the first electronic unit 110 is different from the height of the second portion 1402 corresponding to the second electronic unit 120, the maximum height of the first portion 1401 and the second portion 1402 is referred to as the maximum height H2. For example, in some embodiments, the height of the third portion 1403 may be not significantly different from the maximum height of the first portion 1401 and the second portion 1402. According to some embodiments of the present disclosure, the height H1 of the third portion 1403 and the maximum height H2 of the first portion 1401 and the second portion 1402 may satisfy $0.9 \leq (H1/H2) \leq 1.1$.

A circuit layer 150 may be disposed on the insulating layer 140, so that the first electronic unit 110 may be electrically connected to the bonding pad 130 through the circuit layer 150 on the insulating layer 140. In addition, the bonding pad 130 may be electrically connected to the second electronic unit 120 through the circuit layer 150 on the insulating layer 140. The circuit layer 150 may include a composite layer structure. The circuit layer 150 of the composite layer structure may include multiple conductive layers and multiple insulating layers (represented by the insulating layers 159), wherein the circuit layer 150 may, for example, at least include a first conductive layer 151, a second conductive layer 152 and a stud 153, but the present disclosure is not limited thereto. The stud may be for example UBM (an upper metal bonding pad), and a conductive material may be disposed on the stud. The conductive material may be for example a solder, a Cu pad, an Al pad or other suitable materials, but the present disclosure is not limited thereto. An external electronic component, such as a PCB board, an IC, a capacitor or other suitable electronic components may be electrically connected to the first electronic unit or to the second electronic unit through the stud, but the present disclosure is not limited thereto. The multi-layer conductive layer and the multi-layer insulating layer may stack on one another to form a fan-out panel level packaging (FOPLP), to be beneficial for the electronic device to have higher input/output (I/O) density, or to reduce the size of the electronic device.

The space between the first conductive layer 151 and the second conductive layer 152 is d. The space is the minimum distance between the first conductive layer 151 and the second conductive layer 152 which are connected to and in contact with the same bonding pad 130. For example, in a top view, the space d is the minimum distance between an end point of the first conductive layer 151 and an end point of the second conductive layer 152. The first conductive layer 151 or the second conductive layer 152 may respectively have an appropriate conductive layer width. The conductive layer width of the first conductive layer 151 may be the minimum distance in the vertical direction along the extension direction of the first conductive layer 151 itself. Please refer to the above-mentioned method of the conductive layer width of the first conductive layer 151 for the calculation of the conductive layer width of the second conductive layer 152. If the conductive layer width of the first conductive layer 151 and the conductive layer width of the second conductive layer 152 are different, the maximum conductive layer width of the first conductive layer 151 and the second conductive layer 152 is referred to as the maximum width W. For example, in some embodiments, to be advantageous to have good electrical insulation, there may be an appropriate space d disposed between the first conductive layer 151 and the second conductive layer 152. According to some embodiments of the present disclosure, the maximum width W and the space d may satisfy $d \geq (W/2)$, to facilitate the electronic device 100 to have good electrical insulation.

According to some embodiments of the present disclosure, the circuit layer 150 may include a first conductive layer 151 simultaneously in contact with at least a part of a surface of the first electronic unit 110, for example at least a part of the top surface 110T of the first electronic unit 110, at least a part of a surface 140S of the insulating layer 141, and at least a part of a surface 131S of the conductor layer 131 so that the first electronic unit 110 may be electrically connected to the conductor layer 131 of the bonding pad 130 through the circuit layer 150 on the insulating layer 140. According to some embodiments of the present disclosure, the circuit layer 150 may include a second conductive layer 152 simultaneously in contact with at least a part of a surface of the second electronic unit 120, for example at least a part of a top surface 120T of the second electronic unit 120, at least another part of the surface 140S of the insulating layer 141, and at least another part of the surface 131S of the conductor layer 131 so that the conductor layer 131 of the bonding pad 130 may be electrically connected to the second electronic unit 120 through the second conductive layer 152 of the circuit layer 150. In other words, the first electronic unit 110 may be bonded to the second electronic unit 120 via the electrical connection to the bonding pad 130.

According to the method for forming a semiconductor device according to some embodiments of the present disclosure, a connecting element (for example, the bonding pad in the above-mentioned embodiment) may be arranged between two adjacent semiconductor units of an electronic device to reduce the problem of electrical reliability such as abnormal mutual electrical connection caused by the positional deviation of the semiconductor units. Such a connecting element has the advantage of improving the reliability of the electronic device, for example, improving the electrical reliability of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a first electronic unit and a second electronic unit;
a bonding pad disposed between the first electronic unit and the second electronic unit, wherein the bonding pad comprises a plurality of bonding pad regions which are not connected to each other;
an insulating layer disposed corresponding to the first electronic unit, to the second electronic unit and to the bonding pad; and
a circuit layer;
wherein, the first electronic unit is electrically connected to the second electronic unit through the circuit layer and through the bonding pad.

2. The electronic device of claim 1, wherein the bonding pad further comprises:
a base layer; and
a conductor layer disposed corresponding to the base layer.

3. The electronic device of claim 2, wherein the circuit layer comprises a first conductive layer in contact with at least a part of a surface of the first electronic unit, with at least a part of a surface of the insulating layer and with at least a part of a surface of the conductor layer.

4. The electronic device of claim 3, wherein the circuit layer comprises a second conductive layer in contact with at least a part of a surface of the second electronic unit, with at least another part of the surface of the insulating layer and with at least another part of the surface of the conductor layer.

5. The electronic device of claim 2, wherein the base layer comprises at least one rounded corner.

6. The electronic device of claim 1, wherein the circuit layer comprises a first conductive layer and a second conductive layer, a space between the first conductive layer and the second conductive layer is d, a maximum width of one of the first conductive layer and the second conductive layers is W, and $d \geq (W/2)$.

7. The electronic device of claim 1, wherein a maximum thickness of one of the first electronic unit and the second electronic unit is T1, a thickness of the bonding pad is T2, and T1≥T2.

8. The electronic device of claim 1, wherein the insulating layer comprises a first portion, a second portion and a third portion, the first portion corresponds to the first electronic unit, the second portion corresponds to the second electronic unit, and the third portion corresponds to the bonding pad, a height of the third portion is H1, a maximum height of one of the first portion and the second portion is H2, and 0.9≤(H1/H2)≤1.1.

9. The electronic device of claim 1, wherein in a top view of the electronic device, an angle θ is between an extension direction of the bonding pad and an extension direction of an edge of the first electronic unit close to the bonding pad, and 0≤θ<45°.

10. A method of forming an electronic device, comprising:
  providing a substrate comprising a bonding pad, a first electronic unit and a second electronic unit;
  dividing the bonding pad by laser to form a plurality of bonding pad regions; and
  providing an insulating layer on the substrate, wherein the insulating layer is correspondingly provided with respect to the bonding pad, to the first electronic unit and to the second electronic unit;
  wherein, the bonding pad is disposed between the first electronic unit and the second electronic unit, and the bonding pad is electrically connected to the first electronic unit and to the second electronic unit.

11. The method of forming the electronic device of claim 10, wherein the bonding pad is provided on the substrate before the first electronic unit and the second electronic unit are provided on the substrate.

12. The method of forming the electronic device of claim 10, wherein the first electronic unit and the second electronic unit are provided on the substrate before the bonding pad is provided on the substrate.

13. The method of forming the electronic device of claim 10, wherein an extension direction of the bonding pad and an extension direction of a side of the first electronic unit close to the bonding pad have an angle θ, and 0≤θ<45°.

14. The method of forming the electronic device of claim 10, further comprising:
  providing a circuit layer on the insulating layer, and the first electronic unit is electrically connected to the second electronic unit through the circuit layer and through the bonding pad.

15. The method of forming the electronic device of claim 14, wherein the circuit layer comprises a first conductive layer in contact with at least a part of a surface of the first electronic unit, with at least a part of a surface of the insulating layer and with at least a part of a surface of a conductor layer included in the bonding pad.

16. The method of forming the electronic device of claim 14, wherein the circuit layer comprises a first conductive layer and a second conductive layer, a space between the first conductive layer and the second conductive layer is d, a maximum width of one of the first conductive layer and the second conductive layers is W, and d≥(W/2).

17. The method of forming the electronic device of claim 10, wherein a maximum thickness of one of the first electronic unit and the second electronic unit is T1, a thickness of the bonding pad is T2, and T1≥T2.

18. The method of forming the electronic device of claim 10, wherein the insulating layer comprises a first portion, a second portion and a third portion, the first portion corresponds to the first electronic unit, the second portion corresponds to the second electronic unit, and the third portion corresponds to the bonding pad, a height of the third portion is H1, a maximum height of one of the first portion and the second portion is H2, and 0.9≤(H1/H2)≤1.1.

* * * * *